(12) United States Patent
Kumada

(10) Patent No.: US 10,468,368 B2
(45) Date of Patent: Nov. 5, 2019

(54) POWER SEMICONDUCTOR DEVICE HAVING VOID FILLED WITH RESIN

(71) Applicant: Mitsubishi Electric Corporation, Tokyo (JP)

(72) Inventor: Sho Kumada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/029,760

(22) Filed: Jul. 9, 2018

(65) Prior Publication Data

US 2019/0103374 A1  Apr. 4, 2019

(30) Foreign Application Priority Data

Oct. 4, 2017  (JP) .................. 2017-194118

(51) Int. Cl.
*H01L 23/31* (2006.01)
*H01L 23/00* (2006.01)
(Continued)

(52) U.S. Cl.
CPC ............ *H01L 24/29* (2013.01); *H01L 21/565* (2013.01); *H01L 23/295* (2013.01); *H01L 23/3142* (2013.01); *H01L 24/32* (2013.01); *H01L 24/83* (2013.01); *B23K 20/16* (2013.01); *B23K 2101/40* (2018.08); *H01L 23/3121* (2013.01); *H01L 2224/29078* (2013.01); *H01L 2224/29239* (2013.01); *H01L 2224/29244* (2013.01); *H01L 2224/29247* (2013.01); *H01L 2224/29255* (2013.01); *H01L 2224/32225* (2013.01); *H01L 2224/8384* (2013.01); *H01L 2224/83201* (2013.01); *H01L 2924/1033* (2013.01); *H01L 2924/10253* (2013.01); *H01L 2924/10254* (2013.01); *H01L 2924/10272* (2013.01); *H01L 2924/12032* (2013.01); *H01L 2924/13055* (2013.01); *H01L 2924/13091* (2013.01)

(58) Field of Classification Search
CPC ............... H01L 23/3142; H01L 23/315; H01L 23/49811; H01L 2224/81203
See application file for complete search history.

(56) References Cited

U.S. PATENT DOCUMENTS

2009/0189264 A1  7/2009  Yato et al.
2011/0001233 A1*  1/2011  Iwase .................... H01L 21/563
                                                                257/737
(Continued)

FOREIGN PATENT DOCUMENTS

JP  2009-206482 A   9/2009
JP  2011-165871 A   8/2011
JP  2011-249257 A  12/2011

*Primary Examiner* — Hoai V Pham
(74) *Attorney, Agent, or Firm* — Studebaker & Brackett PC

(57) ABSTRACT

Provided is a technique of improving joint strength between a joining layer and a resin. A power semiconductor device includes a wiring member, a semiconductor element, a joining layer joining the wiring member and the semiconductor element to each other, and a resin covering the wiring member, the semiconductor element, and the joining layer. The joining layer includes a first joining layer provided to be adjacent to the resin and having a void filled with the resin. A filler contained in the resin has a maximum width greater than a minimum diameter of the void in the first joining layer.

7 Claims, 5 Drawing Sheets

(51) Int. Cl.
*H01L 23/29* (2006.01)
*H01L 21/56* (2006.01)
*B23K 101/40* (2006.01)
*B23K 20/16* (2006.01)

(56) References Cited

U.S. PATENT DOCUMENTS

2011/0192630 A1    8/2011   Ishino et al.
2011/0290863 A1   12/2011   Kajiwara et al.

\* cited by examiner

POWER SEMICONDUCTOR DEVICE HAVING VOID FILLED WITH RESIN

BACKGROUND OF THE INVENTION

Field of the Invention

The present invention relates to power semiconductor devices including wiring members and semiconductor elements joined to the wiring members.

Description of the Background Art

Semiconductor devices, particularly, power semiconductor devices are used for the control of main electric power (power) for various equipment such as industrial apparatuses, home appliances, and information terminals. The power semiconductor devices need to be highly reliable particularly in transport apparatuses or other equipment. Meanwhile, a power semiconductor device has been developed that includes a semiconductor element formed of a wide-bandgap semiconductor made of, for instance, silicon carbide (SiC) instead of conventional silicon (Si). Such a power semiconductor device has been developed to have high power density and operate at high temperature.

To enhance joint reliability during high-temperature operation, not only the heat resistance of the semiconductor element per se, but also the reliability of a joining material that joins the semiconductor element to circuit members needs to be enhanced. Accordingly, proposed is a method for manufacturing a power semiconductor device, including sintering joining that is a process of joining the semiconductor element to the circuit members, such as a circuit substrate and a heatsink, with a joining material containing a sintered metal compact (e.g., Japanese Patent Application Laid-Open No. 2011-249257).

Meanwhile, metal particles typically have surface states much more active than those of bulk metal when having particle diameters smaller than a predetermined size, thereby facilitating reaction progress for reduced surface energy. Thus, the joining material, used in sintering joining, contains sintered metal particles with sizes ranging from nanometer-order to several-micrometer-order. The sintered metal particles in such a joining material melt and solidify at a temperature lower than the melting point of the bulk metal, but does not melt again until the temperature reaches the melting point of the bulk metal after a joining process using the joining material. Thus, sintering joining with the sintering metal particles enables joining at a temperature lower than the melting point of metal, such as the bulk metal, thereby achieving a power semiconductor device that prevents damage on members resulting from a rise in joining temperature and prevents an increase in manufacture cost, and that has higher heat resistance than the joining temperature.

Meanwhile, the sintered metal particles, which are highly reactive, are covered with an organic protective film in order to prevent reaction progress before a joining process. This organic protective film is decomposed and removed by heating in the joining process. This promotes contact between the metal particles. Accordingly, sintering progresses, thereby enabling joining.

Unfortunately, in a transfer-molded power module in which a semiconductor element is joined to a wiring member with sintered metal particles, adhesion strength between a sintered metal compact and a resin is insufficient. This causes the resin to detach from a joining layer of the sintered metal compact or other components.

SUMMARY

To solve the above problem, it is an object of the present invention to provide a technique of improving joint strength between a joining layer and a resin.

A power semiconductor device according to an aspect of the present invention includes a wiring member, a semiconductor element, a joining layer joining the wiring member and the semiconductor element to each other, and a resin covering the wiring member, the semiconductor element, and the joining layer. The joining layer includes a first joining layer provided to be adjacent to the resin and having a void filled with the resin. A filler contained in the resin has a maximum width greater than a minimum diameter of the void in the first joining layer.

The resin is firmly anchored to the first joining layer. This improves the adhesion strength between the joining layer and the resin.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
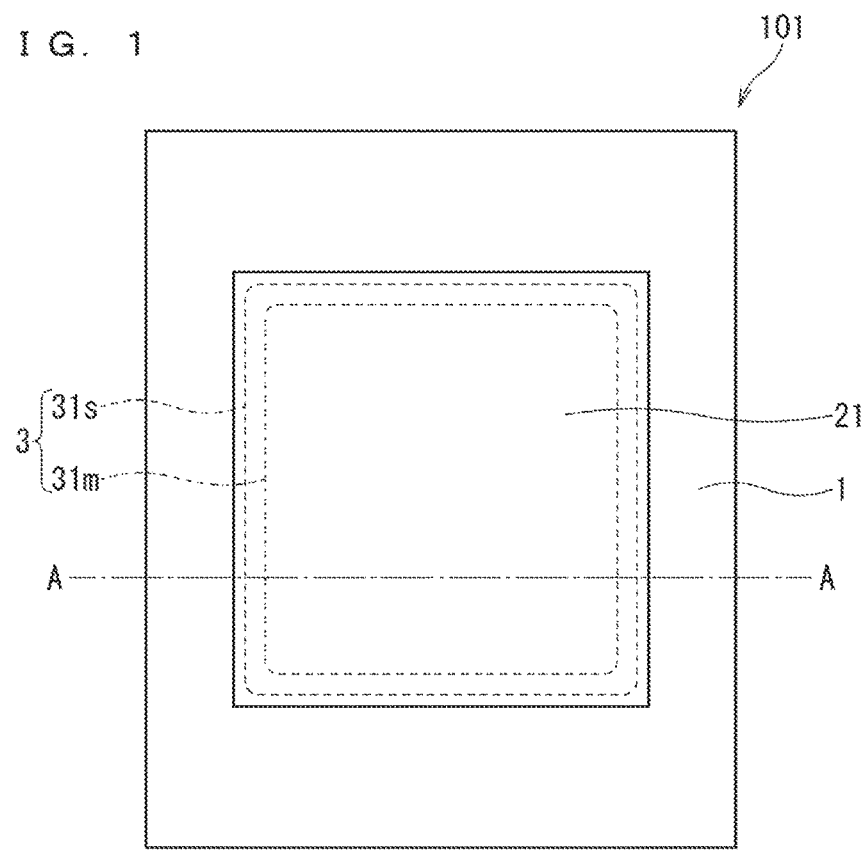
FIG. 1 is a plan view of a configuration of a main part of a power semiconductor device according to a first preferred embodiment.
Figure 2:
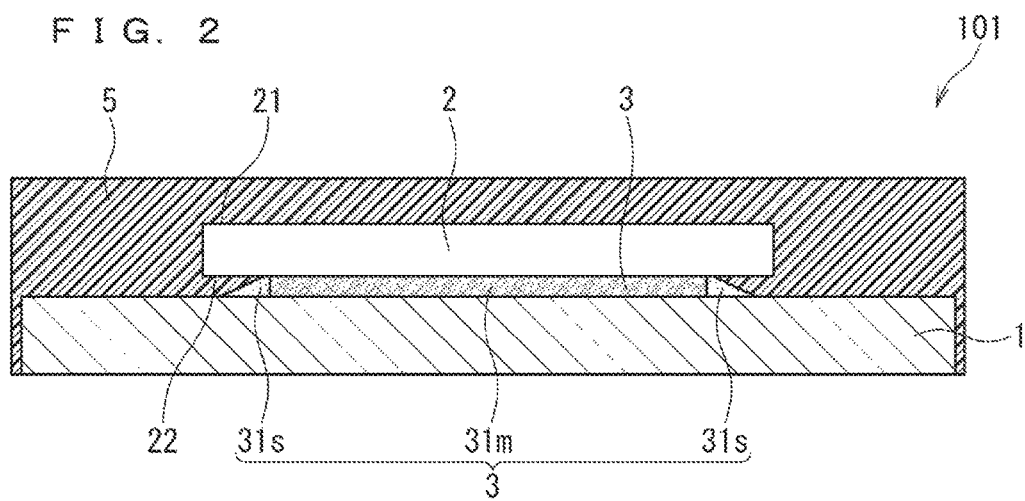
FIG. 2 is a cross-sectional view taken along line A-A in FIG. 1.

FIG. 1 is a plan view of a configuration of a main part of a transfer-molded power semiconductor device 101 according to a first preferred embodiment of the present invention. FIG. 2 is a cross-sectional view taken along line A-A in FIG. 1. It is noted that for clear description, the illustration of wiring members, such as wires are omitted in FIGS. 1 and 2; in addition, the illustration of a resin 5 sealing some components of the power semiconductor device 101 is omitted in FIG. 1.

As illustrated in FIG. 1, the power semiconductor device 101 includes a wiring member 1, a semiconductor element 2, a joining layer 3 joining the wiring member 1 and the semiconductor element 2 to each other, and a resin 5. The resin 5 covers the wiring member 1, the semiconductor element 2, and the joining layer 3 so that the back surface of the wiring member 1 (a surface opposite a surface provided with the semiconductor element 2) is exposed. Further, the power semiconductor device 101 has a transfer-molded structure.

The wiring member 1 is a rectangular block made of metal having high electrical conductivity and high thermal conductivity, such as copper (Cu), an alloy of copper, or aluminum (Al). The wiring member 1 is not limited to a block; practically, various forms are applicable to the wiring member 1. For instance, the wiring member 1 may be an insulating ceramic substrate including a metal wire pattern disposed on a plate called a lead frame or on an insulating ceramic base.

The semiconductor element 2 includes a power semiconductor element, such as a metal oxide semiconductor field-effect transistor (MOSFET), a Schottky barrier diode (SBD), or an insulated gate bipolar transistor (IGBT). The semiconductor element 2 is made of silicon (Si), for instance; alternatively, the semiconductor element 2 is made of a wide-bandgap semiconductor material, such as silicon carbide (SiC), gallium nitride (GaN), or diamond.

The semiconductor element 2 includes a Si IGBT as a switching element in the first preferred embodiment. The semiconductor element 2 is about 0.1 to 0.4 mm thick and has a rectangular main surface 21, for instance. The semiconductor element 2 has a back surface 22 provided with a collector electrode (not shown). Disposed on the main surface 21 are an emitter electrode (not shown), which is a main-power electrode, and a gate electrode, which is a control electrode. In some embodiments, a component, such as a wiring member is joined adjacently to the main surface 21; moreover, a cooler is disposed adjacently to the lower surface of the wiring member 1. Further, the resin 5 seals a surface provided with a circuit including the semiconductor element 2, for instance. The resin 5 is typically a thermosetting resin in a transfer-molded power semiconductor device.

The joining layer 3 contains metal, such as gold (Au), silver (Ag), copper (Cu), or nickel (Ni). The joining layer 3 is made of a sintered-metal joining material that contains aggregate or metal particles, such as Au, Ag, Cu, or Ni, dispersed in an organic constituent (organic dispersion material) to be a paste.

The metal particles with nanometer-level sizes, contained in the sintered-metal joining material, each have a relatively large surface area and thus each have relatively large surface energy. The metal particles are thus highly reactive. Hence, in the sintered-metal joining material, a phenomenon in which the diffusion of metal joining progresses at a temperature lower than the melting point in a bulk state is applicable to its metal. However, with the metal particles alone, which are highly reactive, only room-temperature contact causes sintering. i.e., diffusion joining to progress. The sintered-metal joining material further includes a protective material, such as a protective film covering the surfaces of the metal particles in order to prevent unintentional progress of a sintering reaction resulting from the coagulation of these metal particles. An example of the protective material is an organic dispersion material for independently dispersing and holding the individual metal particles. Moreover, in order to produce a sintering reaction in a joining step, the sintered-metal joining material additionally contains, for instance, a dispersion-material scavenger that reacts with the organic dispersion material by heating to expose the metal particles, and a volatile organic constituent that scavenge a substance generated by the reaction between the organic dispersion material and the dispersion-material scavenger, and then vaporizes and disperses the generated substance. It is noted that pressure application in addition to heating improves joint strength between the metal particles, and obtains a tight joining layer 3.

In the first preferred embodiment, the joining layer 3 includes a first joining layer 31s and a second joining layer 31m. The first joining layer 31s is adjacent to the resin 5. The second joining layer 31m is surrounded by the wiring member 1, the semiconductor element 2, and the first joining layer 31s. The first joining layer 31s has voids filled with the resin 5. The second joining layer 31m has a smaller void rate than the first joining layer 31s. It is noted that a void rate corresponds to the volume of a void per unit volume that is determined by the first joining layer 31s or second joining layer 31m and the voids.

Figure 3:
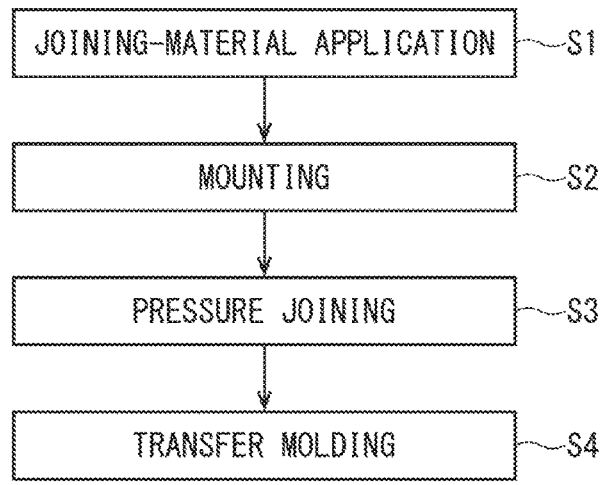
FIG. 3 is a flowchart of main process steps for manufacturing the power semiconductor device according to the first preferred embodiment.

The following describes a method for manufacturing the power semiconductor device 101 according to the first preferred embodiment. FIG. 3 is a flowchart of main process steps for manufacturing the power semiconductor device 101 according to the first preferred embodiment, and illustrates a step of manufacturing the joining layer 3, which joins the wiring member 1 and the semiconductor element 2 to each other, and a step of transfer-molding a unified component consisting of them. It is noted that the illustration of a step of wiring the semiconductor element 2 and other process steps are omitted in FIG. 3 for clear description.

The first step is a step S1 or a joining-material application step of applying the sintered-metal joining material onto the wiring member 1 through, for instance, a screen printing process. The printing process for the application of the sintered-metal joining material is performed using a print mask and a squeegee. The application step for material application onto the wiring member 1 includes supplying the sintered-metal joining material in the form of a paste onto a surface of the print mask, and then scraping the paste.

Here, a void rate of the joining layer 3 after joining is regulated by partly adjusting an application amount to regulate a void rate of the paste, or by adjusting a condition of joining, which will be described later on. In the first preferred embodiment, the second joining layer 31m, having a small void rate, and the first joining layer 31s, having a relatively large void rate, are formed in respective desired regions. In this way, the voids in the joining layer 3 reduce the amount of use of the sintered-metal joining material containing the sintered metal particles, which is more expensive than a joining material, such as a solder material. As methods of how to reduce the amount of use of the sintered-metal joining material, reducing an application area and reducing an application thickness throughout an application region are known. However, these methods are unsuitable because they cause a reduction in heat dissipation performance, an increase in electrical resistance, and a reduction in reliability.

The next step is a step S2 or a mounting step of mounting the semiconductor element 2 in a proper position on the sintered-metal joining material as applied to the wiring member 1.

The next step is a step S3 or a pressure joining step of heating a structure formed through the previous steps to a proper temperature (e.g., a temperature of 80° C., a 30-minute treatment) for dry to remove an organic solvent constituent in the sintered-metal joining material. The structure then undergoes pressure application (e.g., a pressure of 10 MPa) while heated to a temperature necessary for joining (e.g., a temperature of 200 to 350° C., a 30-minute treatment) with pressure applied to the sintered-metal joining material by pressing down the semiconductor element 2. The sintered-metal joining material consequently joins, through sintering, a joint surface of the wiring member 1, a joint surface of the semiconductor element 2, and the metal particles to each other. In this way, the joining layer 3, which includes the first joining layer 31s with a large void rate and the second joining layer 31m with a small void rate, is formed.

The final step is a step S4 or a transfer molding step of covering the unified component, which consists of the wiring member 1 and semiconductor element 2 as joined together by the joining layer 3, except the back surface of the wiring member 1, by using the resin 5. This completes the power semiconductor device 101. At this time, the voids in the first joining layer 31s are filled with the resin 5.

For the power semiconductor device 101 as completed, temperature rise and temperature drop are repeated during its operation. Hence, a shearing force is generated at an interface between a sintered metal compact and a resin due to a difference in coefficient of linear expansion. Once this force exceeds adhesion strength between the sintered metal compact and the resin, the resin detaches from the sintered metal compact.

In the first preferred embodiment, the voids in the first joining layer 31s with a large void rate is filled with the resin 5 in the transfer molding step. Such a configuration improves adhesion strength between a sintered metal compact of the first joining layer 31s and the resin thanks to an anchor effect, thereby preventing the detachment of the resin 5 from the sintered metal compact. In addition, the resin 5 is filled through a conventional step (transfer molding). This eliminates an increase in process steps and thus prevents cost increase.

The resin 5 is harder to be filled in the voids in the joining layer 3 directly under the center of the semiconductor element 2 than directly under the outer periphery of the semiconductor element 2. Hence, the first joining layer 31s with a large void rate are preferably disposed directly under the outer periphery of the semiconductor element 2. Moreover, the first joining layer 31s with a large void rate has lower thermal conductivity than the second joining layer 31m with a small void rate, and thus has a low capability of dissipating heat in the semiconductor element 2 to the wiring member 1. Meanwhile, the semiconductor element 2 generates heat during its operation, and temperature near the center of the semiconductor element 2 is easier to rise than temperature near the outer periphery of the semiconductor element 2. For this reason, it is preferable that the first joining layer 31s be disposed in the outer periphery of the semiconductor element 2, and that the second joining layer 31m be disposed in the center of the semiconductor element 2, in view of heat dissipation performance. In this way, regulating the void rate of the joining layer 3 achieves a power semiconductor device that is highly resistant to heat and highly reliable while maintaining the heat dissipation performance between the semiconductor element 2 and the wiring member 1.

Figure 4:
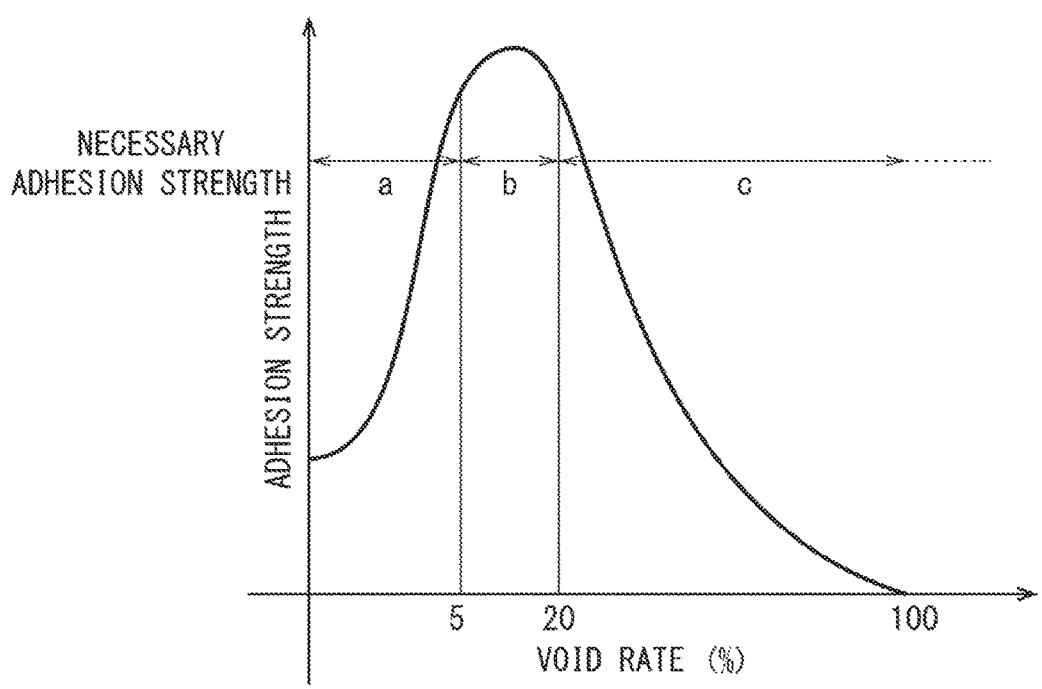
FIG. 4 schematically illustrates the relationship between a void rate of a joining layer and joint strength between the joining layer and a resin.

The following describes the void rate of the joining layer 3. FIG. 4 schematically illustrates the relationship between the void rate of the joining layer 3 and the joint strength between the joining layer 3 and the resin 5.

The resin 5 is hard to get into the joining layer 3 if the void rate of the joining layer 3 is within a range a that is smaller than 5%. Consequently, the anchor effect is not sufficiently achieved, thereby failing to sufficiently improve the adhesion strength between the joining layer 3 and the resin 5. Meanwhile, the joining layer 3 itself has insufficient strength if the void rate of the joining layer 3 is within a range c that is greater than 20%. Consequently, the inside of the joining layer 3 has some growing cracks while the power semiconductor device 101 is operating, thereby reducing reliability. Accordingly, in the first preferred embodiment, the void rate of the first joining layer 31s, included in the joining layer 3, is regulated to be within an adequate range b that is 5% or greater and 20% or smaller in order to improve the adhesion strength between the joining layer 3 and the resin 5, and improve the reliability of the power semiconductor device 101.

Figure 5:
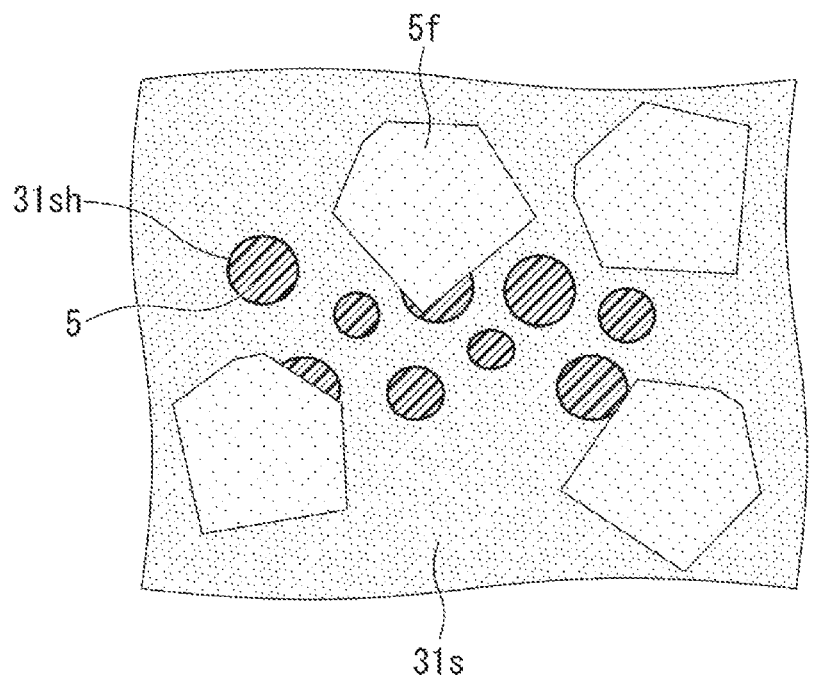
FIG. 5 is an enlarged schematic view of a first joining layer after transfer molding.
Figure 6:
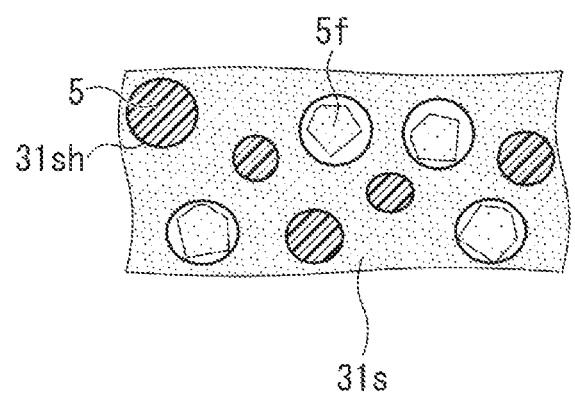
FIG. 6 is an enlarged schematic view of the first joining layer after transfer molding.

The following describes the relationship between the size of a filler 5f contained in the resin 5 and the size of a void 31sh in the first joining layer 31s. FIGS. 5 and 6 are enlarged schematic views of the first joining layer 31s after transfer molding. To be specific, FIG. 5 illustrates the filler 5f having a maximum width greater than a maximum diameter that is a maximum width of the void 31sh in the first joining layer 31s. Moreover, FIG. 6 illustrates the filler 5f hypothetically having a maximum width smaller than or equal to the maximum diameter that is the maximum width of the void 31sh in the first joining layer 31s.

In FIG. 5, the filler 5f does not completely get into the void 31sh; thus the resin 5 is filled in the first joining layer 31s. This enables the resin 5 to be sufficiently anchored to the first joining layer 31s, thereby improving the adhesion strength between the first joining layer 31s and the resin 5. On the other hand, in FIG. 6, the filler 5f is completely within the void 31sh; thus the resin 5 is not filled in a gap between the void 31sh and the filler 5f. This is because the filling of the void 31sh with the resin 5, which has high viscosity, needs the gap having a size greater than or equal to a certain size. As a result, the resin 5 is not sufficiently anchored to the first joining layer 31s in FIG. 6, thereby failing to sufficiently improve the adhesion strength between the first joining layer 31s and the resin 5.

Accordingly, in the first preferred embodiment, the filler 5f, contained in the resin 5, has a maximum width greater than a minimum diameter of the void 31sh in the first joining layer 3 is. Such a configuration achieves the state in FIG. 5, i.e., the anchor effect in at least one void 31sh.

Gist of First Preferred Embodiment

As described above, the power semiconductor device 101 in the first preferred embodiment includes the joining layer 3 joining the semiconductor element 2 and the wiring member 1 to each other. The joining layer 3 includes the first joining layer 31s having the void 31sh filled with the resin 5. The filler 5f contained in the resin 5 has a maximum width greater than the minimum diameter of the void 31sh in the first joining layer 31s. Such a configuration enables the resin 5 to be firmly anchored to the first joining layer 31s, thereby improving the adhesion strength between the joining layer 3 and the resin 5 while preventing the cost increase. This achieves the transfer-molded power semiconductor device 101 that is highly resistant to heat and highly reliable at low cost.

In the above description, the filler 5f, contained in the resin 5, is configured to have a maximum width greater than the minimum diameter of the void 31sh in the first joining layer 31*s*. However, the filler 5*f*, contained in the resin 5, may be configured in any other manner; for instance, the filler 5*f* may have a maximum width greater than a maximum diameter of the void 31*sh* in the first joining layer 31*s*. Such a configuration achieves the state in FIG. 5, i.e., the anchor effect not only in some of the voids 31*sh*, but also in all of the voids 31*sh*.

Figure 7:
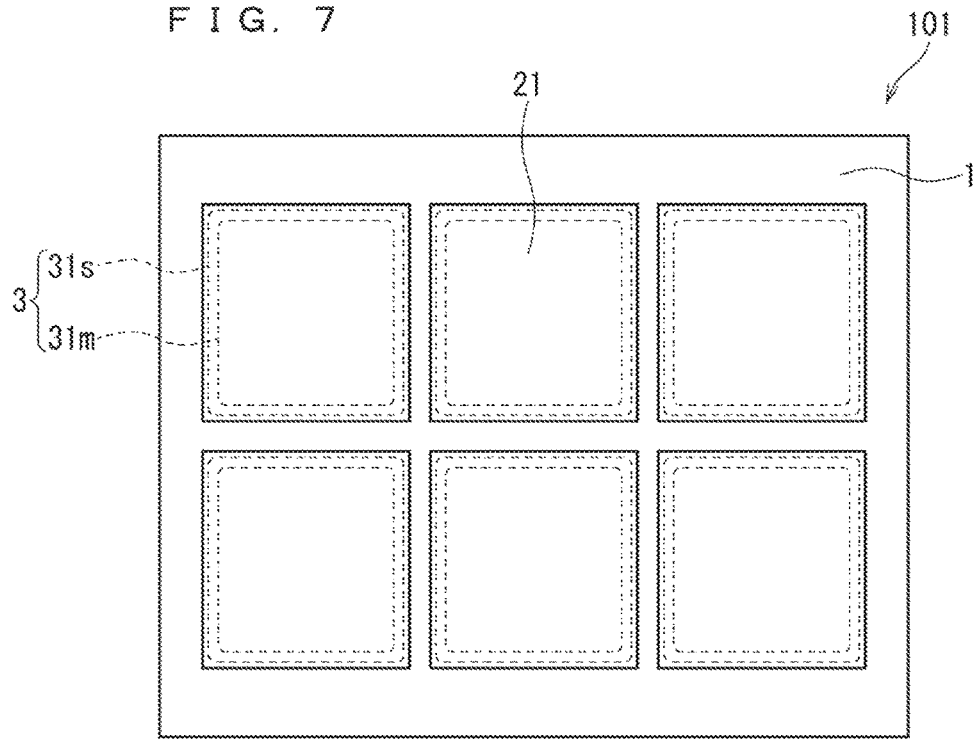
FIG. 7 is a plan view of another configuration of the main part of the power semiconductor device according to the first preferred embodiment.

In the above description, although a single semiconductor element 2 is joined to a single wiring member 1, the number of semiconductor elements 2 is not limited to one. For instance, a plurality of semiconductor elements 2 may be joined to a single wiring member 1 as illustrated in FIG. 7. This configuration enables a joining material joining the individual semiconductor elements 2 to be applied en bloc, and enables the individual semiconductor elements 2 to be pressure-joined en bloc. Thus, this configuration improves productivity.

Second Preferred Embodiment

Figure 8:
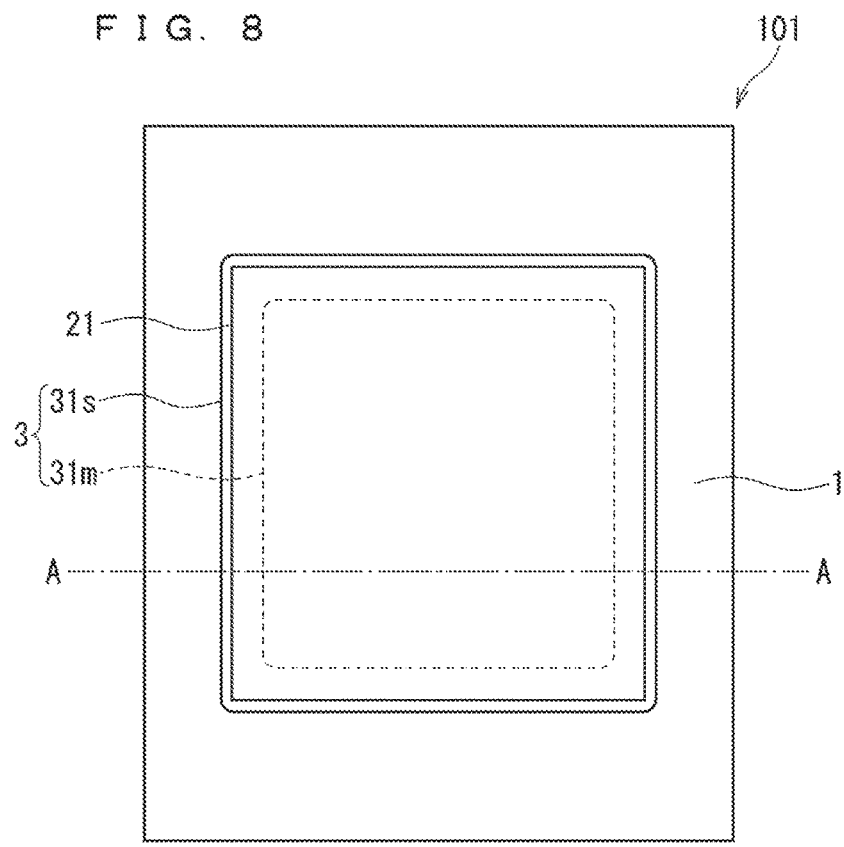
FIG. 8 is a plan view of a configuration of a main part of a power semiconductor device according to a second preferred embodiment.
Figure 9:
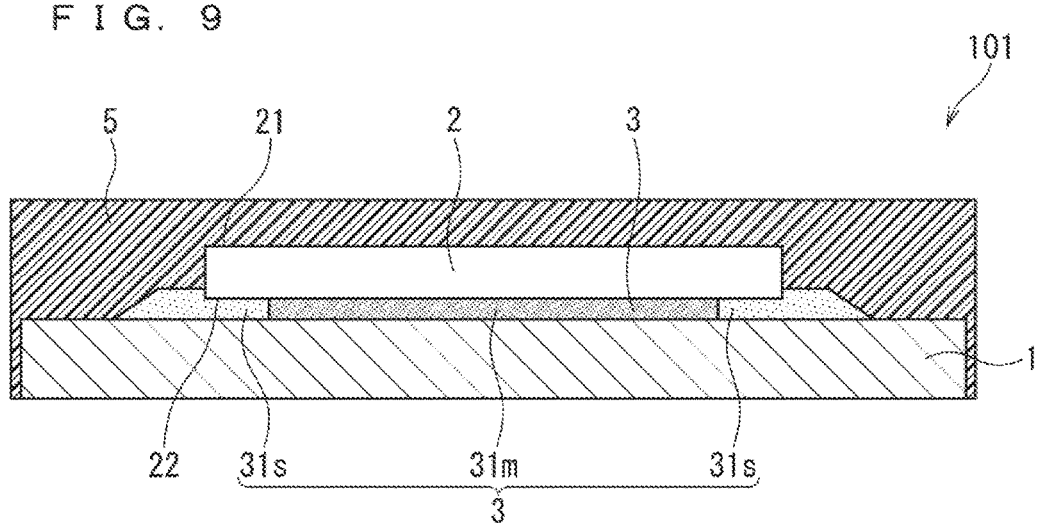
FIG. 9 is a cross-sectional view taken along line A-A in FIG. 8.

FIG. 8 is a plan view of a configuration of the main part of the transfer-molded power semiconductor device 101 according to a second preferred embodiment. FIG. 9 is a cross-sectional view taken along line A-A in FIG. 8. Identical or similar components between the first preferred embodiment and the second preferred embodiment are denoted by the same reference symbols, and mainly described herein are different components between the preferred embodiments.

In the first preferred embodiment, the joining layer 3, which is a sintered metal compact, is disposed only directly under the semiconductor element 2 as illustrated in FIG. 1. In the second preferred embodiment, the joining layer 3 is disposed not only directly under the semiconductor element 2, but also around the semiconductor element 2. In other words, the first joining layer 31*s* is disposed between the wiring member 1 and the semiconductor element 2, and is disposed outside the semiconductor element 2 in plan view.

Gist of Second Preferred Embodiment

Such a configuration in the second preferred embodiment increases the area of contact between the first joining layer 31*s* and the resin 5 when compared to the corresponding configuration in first preferred embodiment. This increases the volume of the first joining layer 31*s* having voids filled with the resin 5, thereby further enhancing the adhesion strength between the joining layer 3 and the resin 5.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
   a wiring member;
   a semiconductor element;
   a joining layer joining the wiring member and the semiconductor element to each other; and
   a resin covering the wiring member, the semiconductor element, and the joining layer,
   wherein the joining layer comprises a first joining layer provided to be adjacent to the resin and comprising a void filled with the resin, and
   a filler contained in the resin has a maximum width greater than a minimum diameter of the void in the first joining layer.

2. The power semiconductor device according to claim 1, wherein the joining layer further comprises a second joining layer provided to be surrounded by the wiring member, the semiconductor element, and the first joining layer, and having a smaller void rate than the first joining layer.

3. The power semiconductor device according to claim 1, wherein the first joining layer is disposed between the wiring member and the semiconductor element, and is disposed outside the semiconductor element in plan view.

4. The power semiconductor device according to claim 1, wherein the first joining layer has a void rate of 5% or greater and 20% or smaller.

5. The power semiconductor device according to claim 1, wherein the joining layer contains silver, gold, copper, or nickel.

6. The power semiconductor device according to claim 1, wherein the resin is a thermosetting resin.

7. The power semiconductor device according to claim 1, wherein the filler, which is contained in the resin, has a maximum width greater than a maximum diameter of the void in the first joining layer.

\* \* \* \* \*